(12) United States Patent
Deane et al.

(10) Patent No.: US 6,377,438 B1
(45) Date of Patent: Apr. 23, 2002

(54) HYBRID MICROELECTROMECHANICAL SYSTEM TUNABLE CAPACITOR AND ASSOCIATED FABRICATION METHODS

(75) Inventors: Philip A. Deane; Joseph Mancusi, both of Durham; Mark W. Roberson, Cary, all of NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 09/694,835

(22) Filed: Oct. 23, 2000

(51) Int. Cl.[7] ................................. H01G 5/01
(52) U.S. Cl. ...................... 361/278; 361/277; 361/292; 361/298.2; 361/291
(58) Field of Search ................................ 361/278, 277, 361/280, 282, 287, 290, 292, 298.2, 291

(56) References Cited

U.S. PATENT DOCUMENTS

| | | | |
|---|---|---|---|
| 2,851,618 A | 9/1958 | Krawinkel | |
| 2,927,255 A | 3/1960 | Diesel | |
| 2,942,077 A | 6/1960 | Diesel | |
| 3,646,413 A | 2/1972 | Oomen | |
| 3,772,537 A | 11/1973 | Clifford et al. | |
| 3,796,976 A | 3/1974 | Heng et al. | |

(List continued on next page.)

FOREIGN PATENT DOCUMENTS

| | | |
|---|---|---|
| DE | 4235593 A1 | 10/1993 |
| EP | 0665590 A2 | 8/1995 |
| EP | 0834759 A2 | 4/1998 |

OTHER PUBLICATIONS

Walker, et al., A Silicon Optical Modulator With 5 MHz Operation for Fiber–in–The—Loop Applications, The 8th International Conference on Solid State Sensors and Actuators and Eurosensors IX, Stockholm, Sweden, Jun. 1995.

Elwenspoek, et al., Active Joints for Microrobot Limbs, J. Micromechanical Microengineering, 1992.

Apte, et al., Deformable Grating Light Valves For High Resolution Displays, Solid State Sensor and Actuator Workshop, Jun., 1994.

(List continued on next page.)

*Primary Examiner*—Dean A. Reichard
*Assistant Examiner*—Nguyen Ha
(74) *Attorney, Agent, or Firm*—Alston & Bird LLP

(57) ABSTRACT

A microelectromechanical system (MEMS) tunable capacitor having low loss and a corresponding high Q is provided. The tunable capacitor includes a first substrate having a first capacitor plate disposed thereon. A fixed pivot structure is disposed on the first surface of the first substrate, proximate the first capacitor plate. The fixed pivot structure as a point of attachment for a flexible membrane that extends outward from the fixed pivot and generally overlies the first capacitor plate. A second substrate is attached to the underside of the flexible membrane and a second capacitor plate is disposed thereon such that the first and second capacitor plates face one another in a spaced apart relationship. A MEMS actuator is operably in contact with the flexible membrane for the purpose of providing an actuation force to the flexible membrane, thereby varying the capacitance between the first and second capacitor plates. In one advantageous embodiment of the invention the first and second capacitor plates are formed of an HTS material and the first and second substrates may be formed of a low signal loss material that is compatible with the HTS materials. The MEMS actuator device used to provide actuation to the flexible membrane of the tunable capacitor may include a MEMS electrostatic flexible film actuator, a MEMS thermal arched beam actuator, a MEMS thermal bimorph actuator, a MEMS piezoelectric actuator or any other MEMS actuation device. Additionally, a method for making a tunable capacitor is provided.

38 Claims, 7 Drawing Sheets

U.S. PATENT DOCUMENTS

| | | | |
|---|---|---|---|
| 4,317,611 A | 3/1982 | Petersen | |
| 4,516,091 A | 5/1985 | Sasser | |
| 4,554,519 A | 11/1985 | Adam | |
| 4,581,624 A | 4/1986 | O'Connor | |
| 4,598,585 A | 7/1986 | Boxenhorn | |
| 4,662,746 A | 5/1987 | Hornbeck | |
| 4,692,727 A | 9/1987 | Wakino et al. | |
| 4,710,732 A | 12/1987 | Hornbeck | |
| 4,736,202 A | 4/1988 | Simpson et al. | |
| 4,747,670 A | 5/1988 | Devoi et al. | |
| 4,789,803 A | 12/1988 | Jacobsen et al. | |
| 4,794,370 A | 12/1988 | Simpson et al. | |
| 4,857,757 A | 8/1989 | Sato et al. | |
| 5,016,072 A | 5/1991 | Greiff | |
| 5,043,043 A | 8/1991 | Howe et al. | |
| 5,051,643 A | 9/1991 | Dworsky et al. | |
| 5,061,049 A | 10/1991 | Hornbeck | |
| 5,075,600 A | 12/1991 | El-Hamamsy et al. | |
| 5,083,857 A | 1/1992 | Hornbeck | |
| 5,097,354 A | 3/1992 | Goto | |
| 5,164,688 A | 11/1992 | Larson | |
| 5,168,249 A | 12/1992 | Larson | |
| 5,172,262 A | 12/1992 | Hornbeck | |
| 5,179,499 A | 1/1993 | MacDonald | |
| 5,202,785 A | 4/1993 | Nelson | |
| 5,203,208 A | 4/1993 | Bernstein | |
| 5,212,582 A | 5/1993 | Nelson | |
| 5,233,459 A | 8/1993 | Bozler et al. | |
| 5,258,591 A | 11/1993 | Buck | |
| 5,260,596 A | 11/1993 | Dunn et al. | |
| 5,268,696 A | 12/1993 | Buck et al. | |
| 5,278,368 A | 1/1994 | Kasano et al. | |
| 5,311,360 A | 5/1994 | Bloom et al. | |
| 5,349,855 A | 9/1994 | Bernstein et al. | |
| 5,353,656 A | 10/1994 | Hawkey et al. | |
| 5,367,136 A | 11/1994 | Buck | |
| 5,367,584 A | 11/1994 | Ghezzo et al. | |
| 5,392,650 A | 2/1995 | O'Brien et al. | |
| 5,406,233 A | 4/1995 | Shih et al. | |
| 5,408,355 A | 4/1995 | Rauch et al. | |
| 5,408,877 A | 4/1995 | Greiff et al. | |
| 5,479,042 A | 12/1995 | James et al. | |
| 5,488,863 A | 2/1996 | Mochida et al. | |
| 5,492,596 A | 2/1996 | Cho | |
| 5,496,436 A | 3/1996 | Bernstein et al. | |
| 5,504,466 A | 4/1996 | Chan-Son-Lint et al. | |
| 5,507,911 A | 4/1996 | Greiff | |
| 5,515,724 A | 5/1996 | Greiff et al. | |
| 5,530,342 A | 6/1996 | Murphy | |
| 5,535,902 A | 7/1996 | Greiff | |
| 5,536,988 A | 7/1996 | Zhang et al. | |
| 5,543,765 A | 8/1996 | Cachier | |
| 5,544,001 A | 8/1996 | Ichiya et al. | |
| 5,552,925 A | 9/1996 | Worley | |
| 5,578,976 A | 11/1996 | Yao | |
| 5,616,864 A | 4/1997 | Johnson et al. | |
| 5,619,061 A | 4/1997 | Goldsmith et al. | |
| 5,620,933 A | 4/1997 | James et al. | |
| 5,627,396 A | 5/1997 | James et al. | |
| 5,629,565 A | 5/1997 | Schlaak et al. | |
| 5,629,790 A | 5/1997 | Neukermans et al. | |
| 5,635,638 A | 6/1997 | Geen | |
| 5,635,639 A | 6/1997 | Greiff et al. | |
| 5,635,640 A | 6/1997 | Geen | |
| 5,635,739 A | 6/1997 | Grieff et al. | |
| 5,638,946 A | 6/1997 | Zavracky | |
| 5,640,133 A * | 6/1997 | Macdonald et al. | 333/197 |
| 5,650,568 A | 7/1997 | Greiff et al. | |
| 5,652,374 A | 7/1997 | Chia et al. | |
| 5,656,778 A | 8/1997 | Roszhart | |
| 5,661,592 A | 8/1997 | Bornstein et al. | |
| 5,666,258 A | 9/1997 | Gevatter et al. | |
| 5,673,139 A | 9/1997 | Johnson | |
| 5,673,785 A | 10/1997 | Schlaak et al. | |
| 5,677,823 A | 10/1997 | Smith | |
| 5,696,662 A | 12/1997 | Bauhahn | |
| 5,723,894 A | 3/1998 | Ueno et al. | |
| 5,818,683 A | 10/1998 | Fujii | |
| 5,848,685 A * | 12/1998 | Smith et al. | 200/275 |
| 5,862,003 A | 1/1999 | Saif et al. | |
| 5,888,845 A * | 3/1999 | Bashir et al. | 438/53 |
| 5,914,553 A | 6/1999 | Adams et al. | |
| 6,215,644 B1 * | 4/2001 | Dhuler | 361/280 |
| 6,229,684 B1 * | 5/2001 | Cowen et al. | 361/278 |

OTHER PUBLICATIONS

Storment, et al., Dry–Released Process for Aluminum Electrostatic Actuators, Solid State Sensor and Actuator Workshop, Jun., 1994.

Legtenberg, et al., Electrostatic Curved Electrode Actuators, IEEE, Jan., 1995.

Breng, et al., Electrostatic Micromechanic Actuators, Micromechanical Microengineering, 1992.

Haji–Babaer, et al., Integrable Active Microvalve with Surface Micromachined Curled–Up Actuator, International Conference on Solid–State Sensors and Actuators, Jun. 1997.

Jaecklin, et al., Mechanical and Optical Properties of Surface Micromachined Torsional Mirrors in Silicon, Polysilicon and Aluminum, $7^{th}$ International Conference on Solid–State Sensors and Actuators, No date.

Gunawan, et al., Micromachined Corner Cube Reflectors as a Communication Link, Sensors and Actuators, 1995.

Jaecklin, et al., Optical Microshutters and Torsional Micromirrors for Light Modulator Arrays, IEEE, 1993.

Klaassen, et al, Silicon Fusion Bonding and Deep Reactive Ion Etching; a New Technology for Microstructures, $8^{th}$ International Conference on Solid–State Sensors and Actuators, Jun. 1995.

Petersen, Single Crystal Silicon Actuators and Sensors Based on Silicon Fusion Bonding Technology, ARPA, Apr. 1994.

Petersen, Single Crystal Silicon Actuators and Sensors Based on Silicon Fusion Bonding Technology, ARPA, Jan. 1995.

Kleiman, et al., Single–Crystal Silicon High–Q Torsional Oscillators, Rev.Sci. Instrum., Nov., 1985.

Petersen, Silicon Torsional Scanning Mirror, IBM J. J. Res. Develop, vol. 24–No. 5, Sep., 1980.

Diem, et al., SOI (SIMOX) As a Substrate For Surface Micromachining of Single Crystalline Silicon Sensors and Actuators, $7^{th}$ Int'l Conference on Solid–State Sensors and Actuators, No date.

Elwenspoek, et al., Static and Dynamic Properties of Active Joints, $8^{th}$ Int'l Conference on Solid–State Sensors and Actuators, Jun. 1995.

Schiele, et al., Surface–Micromachined Electrostatic Microrelay, Sensors and Actuators, 1998.

Deng, et al., The Development of Polysilicon Micromotors for Optical Scanning Applications, No date, No publication.

Buser, et al., Very High Q–factor Resonators in Monocrystalline Silicon, Sensors and Actuators, 1990.

* cited by examiner

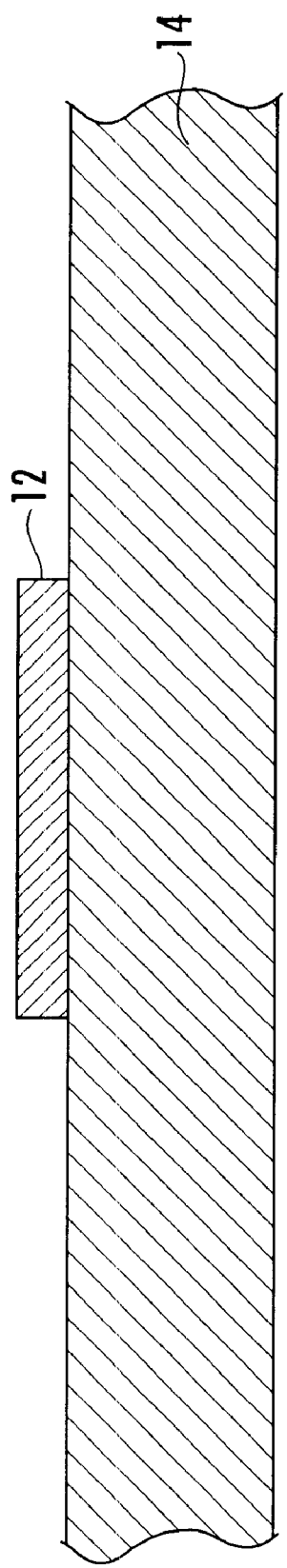

HYBRID MICROELECTROMECHANICAL SYSTEM TUNABLE CAPACITOR AND ASSOCIATED FABRICATION METHODS

FIELD OF THE INVENTION

The present invention relates generally to tunable capacitors and associated fabrication methods and, more particularly, to a hybrid microelectromechanical system (MEMS) tunable capacitor and associated fabrication methods.

BACKGROUND OF THE INVENTION

Microelectromechanical structures (MEMS) and other microengineered devices are presently being developed for a wide variety of applications in view of the size, cost and reliability advantages provided by these devices. For example, one advantageous MEMS device is a variable capacitor in which the interelectrode spacing between a pair of electrodes is controllably varied in order to selectively vary the capacitance between the electrodes. In this regard, conventional MEMS variable capacitors include a pair of electrodes, one of which is typically disposed upon and fixed to the substrate and the other of which is typically carried by a movable actuator or driver. In accordance with MEMS technology, the movable actuator is typically formed by micromachining the substrate such that very small and very precisely defined actuators can be constructed.

While a variable or tunable capacitor can be utilized for many applications, tunable filters frequently utilize variable capacitors in order to appropriately tune the filter to allow or reject signals having predetermined frequencies, while, correspondingly, allowing or rejecting signals having other frequencies. For tunable filters that are utilized for high frequency applications, such as applications involving radio frequency (RF) signals, the tunable filter preferably has low signal loss and a high Q, i.e., a high quality factor. Unfortunately, variable capacitors that include electrodes formed of conventional metals generally do not have a sufficiently high Q for high frequency applications.

While electrodes formed of high temperature superconductor (HTS) materials would advantageously increase the Q of the resulting variable capacitor, the use of HTS materials is generally not compatible with the micromachining techniques, such as required to fabricate the actuator of a conventional MEMS variable capacitor. For example, the typical fabrication of a MEMS flexible membrane capacitor involves a release operation that provides for the membrane to be fabricated on a substrate and then subsequently released during processing. The release operation employs chemicals, i.e., etchants, that would likely damage the superconductor materials by altering their performance characteristics. Additionally, the flexible materials used to fabricate the flexible membrane do not possess the low loss characteristics necessary to render a high Q capacitor. For a more detailed discussion of MEMS flexible membrane capacitors, see U.S. patent application Ser. No. 09/464,010, entitled "Electrostatically Controlled Variable Capacitor", filed on Dec. 15, 1999, in the name of inventor Goodwin-Johansson and assigned to MCNC, the assignee of the present invention. That application is herein incorporated by reference as if set forth fully herein.

As such, MEMS variable capacitors that have improved performance characteristics are desired for many applications. For example, tunable filters having a higher Q so as to be suitable for filtering high frequency signals are desirable, but are currently unavailable.

SUMMARY OF THE INVENTION

A tunable capacitor is therefore provided that is micromachined so as to be precisely defined, extremely small and provide microelectromechanical actuation. In one embodiment the capacitor plates are formed of a high-temperature superconductor (FTS) material. As such the tunable capacitor can be utilized for a wide variety of high performance applications having a high Q requirement. For example, a tunable filter using a tunable high Q capacitor and inductor can appropriately filter high frequency signals, such as radio frequency (rf) signals.

The MEMS tunable capacitor includes a first substrate having a first capacitor plate disposed thereon. A fixed pivot structure is typically disposed on the first substrate, proximate the first capacitor plate. The fixed pivot structure can serve as a point of attachment for a flexible membrane that extends outward from the fixed pivot and generally overlies the first capacitor plate. The MEMS tunable capacitor also includes a flexible membrane and a second capacitor plate carried thereby, typically upon a second substrate mounted to the underside of the flexible membrane, the flexible membrane overlies the first substrate such that the first and second capacitor plates face one another in a spaced apart relationship. A MEMS actuator is operably in contact with the flexible membrane for the purpose of providing an actuation force to the flexible membrane, thereby varying the capacitance between the first and second capacitor plates.

In one advantageous embodiment of the invention the first and second capacitor plates comprise an HTS material and the first and second substrates may comprise a low signal loss material that is compatible with the HTS material. In one embodiment of the invention, the MEMS actuator that is used to provide actuation to the flexible membrane is a MEMS electrostatic flexible film actuator. The flexible film actuator is attached to the first substrate and operably contacts the flexible membrane, typically, at a point furthest from the fixed pivot structure. The flexible film actuator will typically include a third substrate attached to the first substrate and having a substrate electrode disposed thereon. Additionally, a flexible film composite overlies the third substrate and includes an electrode element and at least one biasing element. In lengthwise definition, the flexible film will comprise a fixed portion attached to the underlying third substrate and a distal portion extending from the fixed portion and generally overlying the substrate electrode. An insulator will typically be disposed between the substrate electrode and the flexible film electrode to provide electrical isolation. The flexible film composite is actuated in response to the application of electrostatic force that is applied between the substrate electrode and the flexible film electrode. In response to the actuation of the flexible film, the operably contacted flexible membrane of the tunable capacitor will positionally change and thus vary the capacitance between the first capacitor plate and the second capacitor plate.

In additional embodiments of the invention the MEMS actuator used to provide actuation to the operably contacting flexible membrane may comprise a MEMS thermal arched beam actuator, a MEMS thermal bimorph actuator, a MEMS piezoelectric actuator or any other MEMS actuation means.

Additionally, the present invention is embodied in a method for making a tunable capacitor. The method comprises fabricating a first capacitor plate construct formed of a first substrate having a first capacitor plate disposed thereon, the first capacitor plate, typically, comprising a HTS material. Additionally, the method entails fabricating a MEMS actuator that is responsive to actuation forces and attaching the MEMS actuator to the first substrate proximate the first capacitor plate. A second capacitor plate structure is fabricated that comprises a flexible membrane, a second substrate attached to the flexible membrane, and a second capacitor plate disposed on the second substrate. The second capacitor plate will typically comprise a HTS material. The tunable capacitor is completed by connecting the first capacitor plate structure to the second capacitor plate structure via a fixed pivot structure that allows the first and second capacitor plates to generally face each other in a spaced apart relationship and provides for the flexible membrane of the second capacitor plate structure to be in operable contact with the MEMS actuator.

According to the present invention, a tunable capacitor and an associated fabrication method are provided which permit micromachining techniques to be used to fabricate a tunable capacitor actuated by MEMS actuators. The MEMS actuators may include electrostatic flexible film actuators, thermal bimorph actuators, thermal arched beam actuators, piezoelectric actuators and the like. In one advantageous embodiment the tunable capacitor plates are formed of a high temperature, super conductor material. As such, the tunable capacitor can be precisely defined, small in size and MEMS actuated, while also having improved performance characteristics relative to conventional tunable capacitors. Thus, the tunable capacitors of the present invention can be used in a variety of applications, including those requiring high Q, such as, filtering signals having high frequencies.

BRIEF DESCRIPTION OF THE DRAWINGS

FIGS. 4A–4D are cross-sectional views of the various processing stages used to fabricate the tunable capacitors of the present invention in accordance with one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
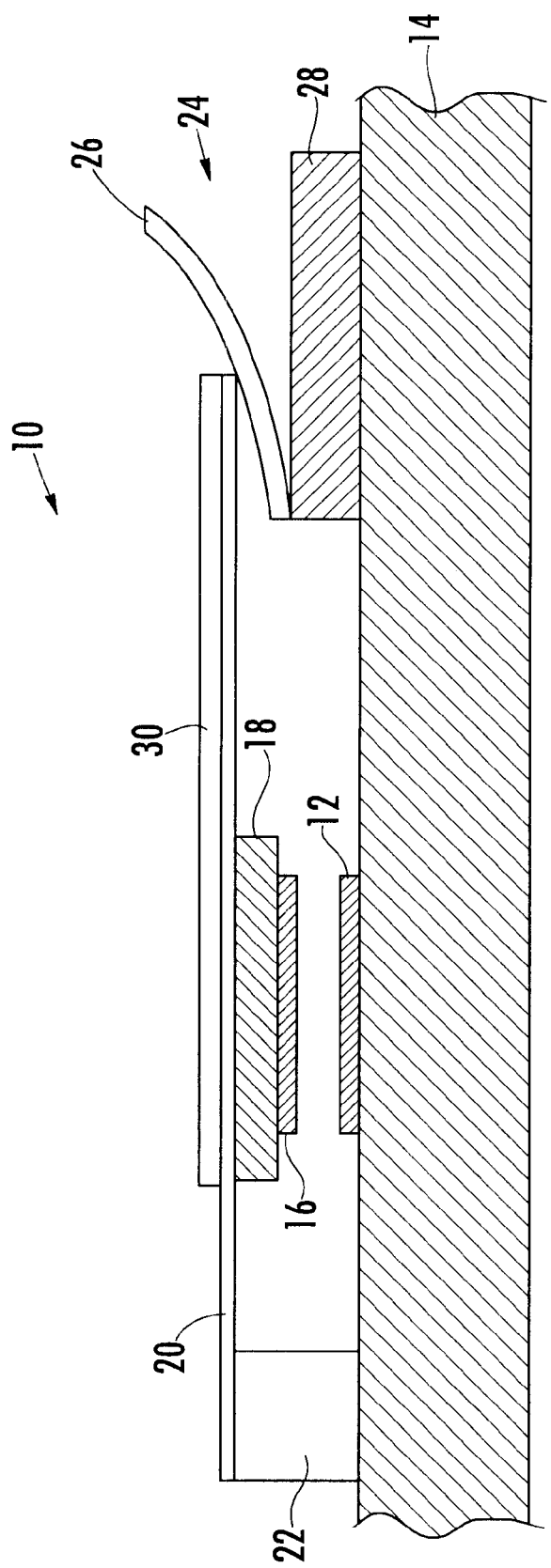
FIG. 1 is a cross-sectional view of a MEMS hybrid tunable capacitor embodying a MEMS electrostatic flexible film actuator, in accordance with one embodiment of the present invention.

Referring to FIG. 1, shown is cross-sectional diagram of the tunable capacitor 10 in accordance with one embodiment of the present invention. FIG. 1 illustrates the variable capacitor of the tunable capacitor comprising a first capacitor plate 12 formed on the surface of first substrate 14 and a second capacitor plate 16 formed on the surface of a second substrate 18. The second capacitor plate and associated second substrate are moveable, via an attached flexible membrane 20, with respect to the stationary first capacitor plate and associated first substrate. To achieve the desired low loss and high Q required of a tunable capacitor used in high frequency applications, such as those that involve radio frequency (RF) signals, the first and second capacitor plates may be formed of a high temperature super conducting (HTS) material. By way of example, these HTS materials include, Yttrium Barium Copper Oxide (YBCO) and Thallium compounds (TBCCO). These HTS materials are available commercially from Superconductor Technologies Incorporated of Santa Barbara, Calif. These HTS materials are susceptible to signal loss if they lie in close proximity to loss-inducing materials. Thus, in order to insure a low loss filter the first and second substrates are, generally, formed of a low loss material when HTS capacitor plates are used. For example, the substrates may be formed of magnesium oxide (MgO), although other low loss materials, such as $LaAlO_3$ or $NdCaAlO_4$ may also be used for the first and second substrates. It should be noted that while those application employing HTS capacitor plates will typically include a first substrate comprising a low loss material, such as MgO that insures low signal loss, it is within the inventive concepts to form the second substrate from other semiconductor-compatible materials, such as quartz or the like.

The tunable capacitor of the present invention may alternatively be formed with non-HTS material capacitor plates. In those applications that do not require higher Q capacitors or warrant the filtering of high frequency signals the first and second capacitor plates 12 and 16 may be formed from a conductive material, such as gold or any other suitable conductive material. Similarly, when standard capacitor plate materials are employed the loss characteristics of the adjoining substrates are no longer a significant concern. Therefore, in non-HTS capacitor plate embodiments, the first and second substrates 14 and 18 may be formed from silicon or any other suitable microelectronic substrate material may be used.

The second substrate 18 and corresponding second capacitor plate are affixed to a flexible membrane 20. The flexible membrane will typically comprise a single layer of a chosen flexible material, although the flexible membrane may also comprise a multilayered sandwich-like construction of more than one flexible material. The flexible membrane may be fabricated from polysilicon or any other suitable flexible dielectric material(s) may be used to form the membrane. One end of the flexible membrane is secured to the underlying first substrate 12 via a fixed pivot structure 22, such that the unattached portion of the flexible membrane extends in a cantilevered manner overlying the first capacitor plate. The fixed pivot structure will typically comprise metal, silicon or any other suitable dielectric material. The height of the fixed pivot structure will be instrumental in defining the initial separation between the first and second capacitor plates. Typically, the first and second capacitor plates will have a separation within the range of about 50 microns to about 4 millimeters.

By electrically connecting the first and second capacitor plates 12, 16 to respective electrical leads in a manner known by those of ordinary skill in the art, the variable capacitor can be used in a tunable filter. By varying the spacing between the capacitor plates the filtering characteristics can be controllably modified to either allow or reject signals having a predetermined range of frequencies, while correspondingly rejecting or allowing signals having frequencies outside the predetermined range The tunable nature of the capacitor is exhibited by altering the spacing between the second capacitor plate and the first capacitor plate thereby changing capacitance. In the embodiment shown in FIG. 1 displacement of the second capacitor plate is produced via actuation of the MEMS actuator device 24 that is positioned near the distal end of the flexible membrane. The MEMS actuator device provides the impetus to raise and lower the flexible membrane relative to the first substrate and thus vary the spacing between the first and second capacitor plates. By varying the spacing between the capacitor plates, the capacitance of the circuit is varied and correspondingly provides a tunable filter. In the embodiment shown the MEMS actuator device comprises an electrostatically activated flexible flap actuator. A flexible flap 26 is affixed to an underlying third substrate 28. The third substrate is typically attached to the underlying first substrate 14, either directly as shown or indirectly. Since, typically, the MEMS flexible flap actuator will not be formed of HTS materials; the third substrate may comprise silicon or any other suitable conventional substrate material. In operation, an electrostatic force is applied between an electrode element in the flexible flap and an electrode element in the third substrate. Typically, the electrostatic force serves to move the flexible flap toward the third substrate or, alternatively, the force may serve to move the flexible flap away from the third substrate. In turn, the movement of the flexible flap toward the third substrate causes the suspended flexible membrane 20 (and attached second substrate 18 and second capacitor plate 16) to move in such a manner as to vary the capacitance or inductance of the circuit.

Figure 2:
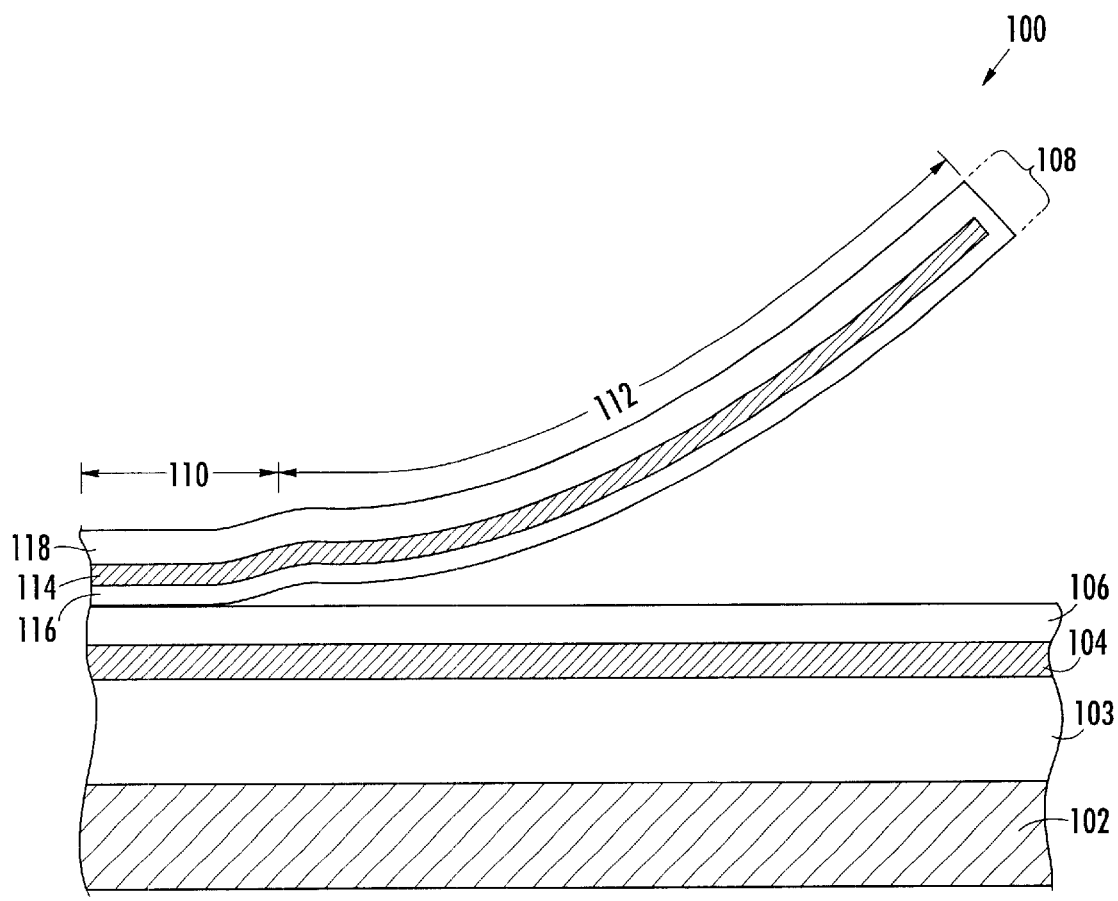
FIG. 2 is a cross-sectional view of a MEMS electrostatic flexible film actuator, in accordance with one embodiment of the present invention.

FIG. 2 illustrates a cross-sectional view of a MEMS flexible flap actuator 100, in accordance with an embodiment of the present invention. The flexible flap actuator comprises in layers, a microelectronic substrate 102, a substrate electrode 104, a dielectric element 106, and a flexible flap 108. Additionally, the flexible flap actuator may comprise, if necessary, an electrical insulation element 103 layered between the substrate electrode and the substrate that provides insulation between the electrode and the substrate. The flexible flap is typically a composite structure that overlies the microelectronic substrate and substrate electrode. Along its length, the flexible flap has a fixed portion 110 and a distal portion 112. The fixed portion is substantially affixed to the underlying microelectronic substrate or intermediate layers. The distal portion extends from the fixed portion and is released from the underlying microelectronic substrate during fabrication process.

The flexible flap 108 comprises multiple layers including at least one electrode element 114 and one or more biasing elements 116 and 118. The number of layers, thickness of layers, arrangement of layers, and choice of materials used may be selected to cause the flexible flap to curl toward, curl away, or remain parallel to the underlying microelectronic substrate electrode. Thus, the distal portion can be biased to curl as it extends away from the fixed portion. In operation, electrostatic voltage is applied across the substrate electrode 104 and the at least one electrode element 114 to cause the flexible flap to be attracted towards the substrate electrode. This attractive force causes the flexible flap to unroll and, thus, alters the separation between the flexible flap and the underlying microelectronic substrate. As a result of this alteration in separation between the flap and the substrate, the flexible membrane (not shown in FIG. 2) which is supported by the electrostatically activated flexible flap is spatially altered. The spatial alteration of the flexible membrane directly alters the separation between the capacitor plates and, thus alters the capacitance that exists between the plates.

For further discussion of MEMS flexible flap actuators, see U.S. Pat. No. 6,057,520, entitled "High Voltage Micromachined Electrostatic Switch", issued on May 2, 2000, in the name of inventor Goodwin-Johansson and assigned to MCNC, the assignee of the present invention. The '520 Patent provides for a MEMS flexible flap actuator that embodies an electrostatically activated switch and/or relay device. That patent is herein incorporated by reference as if set forth fully herein.

The MEMS device used as an actuation means in the present invention is not limited to electrostatically activated flexible flap actuators. It is also possible to use other MEMS actuators, such as thermal bimorph actuators, thermal arched beam actuators and piezoelectric actuators. In a typical thermal bimorph actuator a micro cantilever is constructed from materials having different thermal coefficients of expansion. When the actuator is heated, the bimorph layers arch differently, causing the micro cantilever to move accordingly. For an example of a MEMS thermal bimorph actuator see U.S. Pat. No. 5,463,233 entitled "Micromachined Thermal Switch", issued on Oct. 31, 1995, in the name of inventor Norling et. al. In the '233 Patent the bimorph thermal actuator implements a switch and/or relay device. In a typical thermal arched beam actuator one or more micro arched beams are heated so as to impart further arching of the beams. The arching of the beams imparts motion to an associated actuator member. For an example of a thermal arched beam actuator, see U.S. Pat. No. 5,909,078, entitled "Thermal Arched Beam Microelectromechanical Actuators", issued Jun. 1, 1999 in the name of inventors Wood et. al. In a typical piezoelectric actuator a piezoelectric material, such as Lead Zirconate Titanate (PZT) or the like is deployed in the actuator construct. By controlling the amount of voltage supplied to the piezoelectric material the amount of deflection in the actuator can be controlled accordingly. For an example of a piezoelectric actuator see U.S. Pat. No. 5,870,007, entitled "Multi-Dimensional Physical Actuation of Microstructures", issued on Feb. 9, 1999, in the name of inventors Carr et al. In the '007 Patent piezoelectric materials are used in a cantilever arm to deflect and provide movement to an associated platform. Use of these alternate means of MEMS actuation is well known by those of ordinary skill in the art. Additionally, any other MEMS actuator device that is capable of providing the necessary movement to the flexible membrane 22 to vary the capacitance or inductance between the first and second capacitor plates is also within inventive concepts herein disclosed and may be used in conjunction with the MEMS tunable filter of the present invention.

The tunable capacitor of the present invention may also comprise a support element 30. The support element is typically fabricated on the flexible membrane 20 and provides rigidity to the flexible membrane in those areas that it overlies. Typically the support element will overlie at least a portion of the area overlying the second substrate and the area overlying the region that contacts the MEMS actuator device. Generally, the area nearest the fixed pivot structure 22 will be devoid of an overlying support element so as to allow for the flexible membrane to flex in this region. The support element provides stability to the overall flexible membrane/second capacitor plate construct and insures precise movement of the membrane and attached second capacitor plate. Additionally, the support element provides the tunable capacitor with a means for resisting structural changes due to vibration since the element itself is typically as or more rigid than other components of the capacitor. The support element is typically formed of a thin metal layer or any other suitable thin rigid, dielectric material may be used. Alternatively, other embodiments of the invention may omit the support element altogether. In those embodiments in which the support element is omitted the second substrate 18 may be extended toward the flexible flap 26 to provide the degree of stability and rigidity required of the tunable capacitor for a given application.

Figure 3:
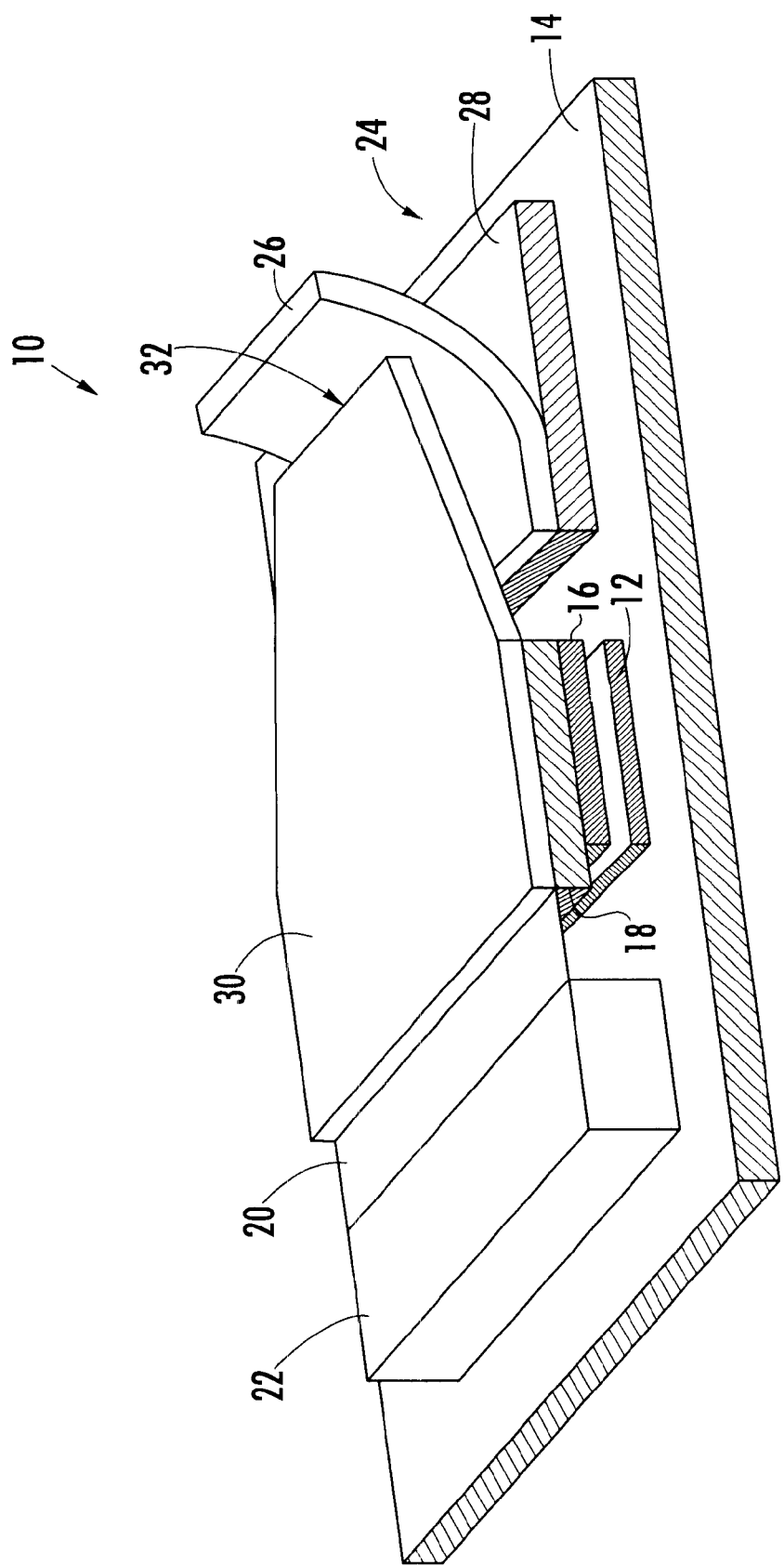
FIG. 3 is a plan view of a MEMS hybrid tunable capacitor highlighting the plan view shaping of the flexible membrane and support element, in accordance with another embodiment of the present invention.

FIG. 3 illustrates a perspective view of the hybrid MEMS tunable capacitor 10 in accordance with an embodiment of present invention. The perspective view illustrates that the support element 30 and/or flexible membrane 20 may be formed of a predetermined plan view shape, in this instance a tapered shape at the distal end furthest from the fixed pivot structure 22. The plan view shape of the flexible membrane and support element will be dictated by the nature of the MEMS actuator device being used, the degree of precision in the filtering characteristics of the capacitor and other functional requirements of the capacitor. In the FIG. 3 embodiment the tapered flexible membrane and support element result in a line of contact 32 that generally is equivalent in length to the width of the flexible flap 26 of the actuator device 24. By allowing for tapering to decrease the line of contact and/or mirror the width of the flexible flap the tunable filter benefits from more precise filtering characteristics.

Characteristically HTS materials are generally not compatible with the silicon micromachining used to fabricate MEMS actuator devices. Therefore, in accordance with a method for fabrication of the tunable capacitors of the present invention, the filter and the MEMS actuator device are fabricated separately and then assembled into a tunable capacitor structure.

Figure 4B:
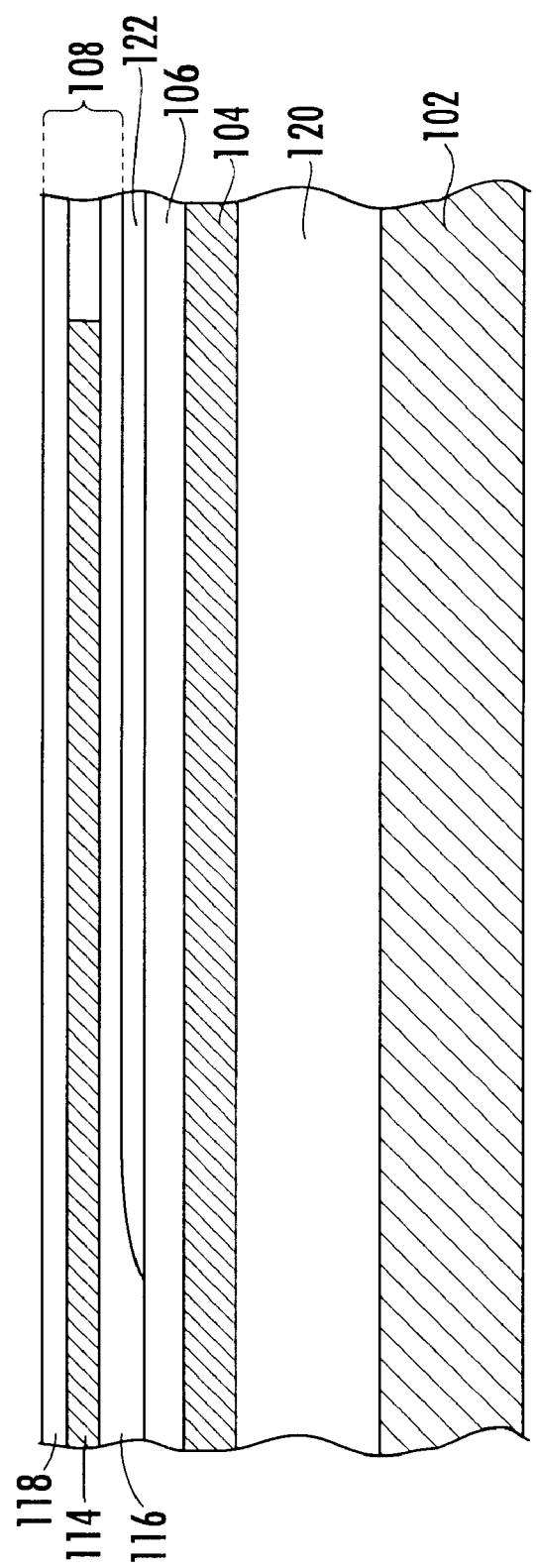

FIGS. 4A–4D illustrate various processing steps in the method for fabricating the tunable capacitors in accordance with an embodiment of the present invention. It will be understood by those having ordinary skill in the art that when a layer or element is described herein as being "on" another layer or element, it may be formed directly on the layer, at the top, bottom or side surface area, or one or more intervening layers may be provided between the layers. Referring to FIG. 4A shown is a cross-sectional view of a first substrate, typically a low loss substrate, formed of a material such as MgO, with superconducting circuitry disposed thereon. The first substrate 14 is polished prior to disposing the first capacitor plate 12 on the surface of the substrate. In embodiments having the capacitor plate formed of a HTS material, the HTS material is disposed on the substrate using standard Metal Organic Chemical Vapor Deposition (MOCVD) techniques or Pulsed Laser Deposition (PLD) techniques. Following the blanketing of HTS film on both sides of the substrate, the capacitor plates and corresponding circuitry are formed by patterning the top side with photoresist and etching to define the structures. The use of MOCVD and PLD techniques is well known by those of ordinary skill in the art. The resulting capacitor plate is preferably about 3 to about 4 microns in thickness, although other capacitor plate thickness may be suitable.

The MEMS actuator device that is used to provide movement to the second capacitor plate is typically formed separately and then subsequently attached to the first substrate. As previously stated, the separate fabrication of the MEMS actuator device is necessary to eliminate the introduction of processing techniques that are detrimental to HTS materials. FIG. 4B illustrates a cross-sectional view of the fabrication of a MEMS electrostatic flexible film actuator device. The electrostatic flexible film actuator is shown by way of example. As discussed above, other MEMS actuator devices, such as thermal arched beam actuators, thermal bimorph actuators and the like may also be used to impart actuation to the second capacitor plate. The MEMS electrostatic actuator is fabricated on a microelectronic substrate 102. This substrate will typically comprise silicon, glass or any other suitable microelectronic material. Low loss characteristics are not required of this substrate as it is not in close proximity to the HTS materials used to form the capacitor plates. A substrate insulating layer 120 may typically be deposited on the microelectronic substrate and provides electrical isolation between the substrate and the subsequently deposited substrate electrode 104. In certain embodiments that implement microelectronic substrate materials having strong insulation characteristics it may be possible to form the MEMS actuator device without the substrate insulating layer. The substrate insulating layer 120 preferably comprises a non-oxidation based insulator or polymer, such as polyimide or nitride. The substrate insulating layer is preferably formed by using a standard deposition technique, such as low-pressure chemical vapor deposition (LPCVD) or conventional spinning, to deposit the insulating layer on microelectronic substrate.

A substrate electrode 104 is deposited on the insulating layer 120, as shown in FIG. 4B, or the substrate electrode may be deposited directly on the microelectronic substrate 102. The substrate electrode preferably comprises a gold layer deposited on the top surface of the insulating layer. In applications that implement gold as the substrate electrode a thin layer of chromium (not shown in FIG. 4B) may be deposited either prior to depositing the electrode or after depositing the electrode to allow for better adhesion to the microelectronic substrate or subsequent dielectric element. Alternatively, other metallic or conductive materials may be used so long as they provide adequate conductivity and are not adversely effected by subsequent release layer processing operations. The surface area and shape of the substrate electrode 104 can be varied as required to create the desired electrostatic forces. In most applications the substrate electrode will be photolithographically patterned with a photoresist and etch process so that it underlies the entirety of the electrode element 114 in the flexible film 108 to insure the maximum possible closing force of the actuator. The substrate electrode should be formed of a generally thin layer of material to maximize electrostatic force but should be thick enough that it does not break down electrically.

A dielectric element 106 is deposited on the substrate electrode 14 to electrically isolate the substrate electrode 104 from the electrode element 114 in the flexible film 108. The dielectric element 106 preferably comprises polyimide, although other dielectric insulators or polymers tolerant of release layer processing may also be used. The substrate dielectric layer is formed using a conventional deposition technique, such as LPCVD.

A release layer 122 is deposited on the dielectric element 106 in the area generally underneath the distal portion 112 of the overlying flexible film 108. The release layer is patterned in such fashion that it only is deposited on those regions below the flexible film portions not being fixed to the underlying substrate structure. Preferably, the release layer comprises an oxide or other suitable material that may be etched away when acid is applied thereto. After the overlying layers of the moveable membrane have been deposited on the substrate, the release layer may be removed through standard microengineering acidic etching techniques, such as a hydrofluoric acid etch. When the release layer has been removed, the distal portion 112 of moveable membrane 108 is separated from the underlying surface. The release of the moveable membrane from the substrate in conjunction with the biasing characteristics of the biasing element will typically result in the thin film flexible membrane having a distal portion that has a curled shape. Biasing in the moveable membrane will typically result in the moveable membrane curling away from the microelectronic substrate (as shown in FIG. 4B) when no electrostatic force is applied. It is also possible to bias the moveable membrane such that it curls toward the microelectronic substrate when no electrostatic force is applied.

The layers of the moveable membrane 108 generally overlie the substrate electrode 104. Known integrated circuit manufacturing processes are used to construct the layers comprising moveable membrane 108. Preferably, one or more layers of the flexible film comprise the electrode element and one or more additional layers comprise the biasing element. As shown in FIG. 4B, one preferred embodiment of the flexible film comprises an electrode element layer 114 positioned between two biasing element layers 116 and 118. The layers comprising the moveable membrane are formed from flexible materials, for instance, flexible polymers are used to form the biasing element layers 116 and 118 and flexible conductors are used to form the electrode element layer 114. In a preferred embodiment the biasing element layers will comprise a flexible polymer film, preferably, a polyimide material, however, other suitable flexible materials capable of withstanding the release layer etch process can also be employed. The layers of the moveable membrane are typically deposited by conventional deposition techniques such as spinning, predominantly used in forming polyimide layers, and LCVD used in depositing other non-polymer dielectric materials.

The electrode element 114 of the flexible film 108 preferably comprises a layer of flexible conductor material. The electrode element may be deposited directly upon the release layer or over first biasing element layer 116, as depicted in FIG. 4B. The electrode element preferably comprises gold, although other flexible conductors tolerant of release layer processing, such as conductive polymer films, may also be used. If gold is used to form the electrode element, a thin layer of chromium (not shown in FIG. 4B) may be deposited prior to depositing the gold layer and/or following the gold layer to allow improved adhesion of the gold layer to the adjacent biasing element layers. The electrode element layer will typically be deposited by using a standard deposition technique, such as evaporation.

Figure 4C:
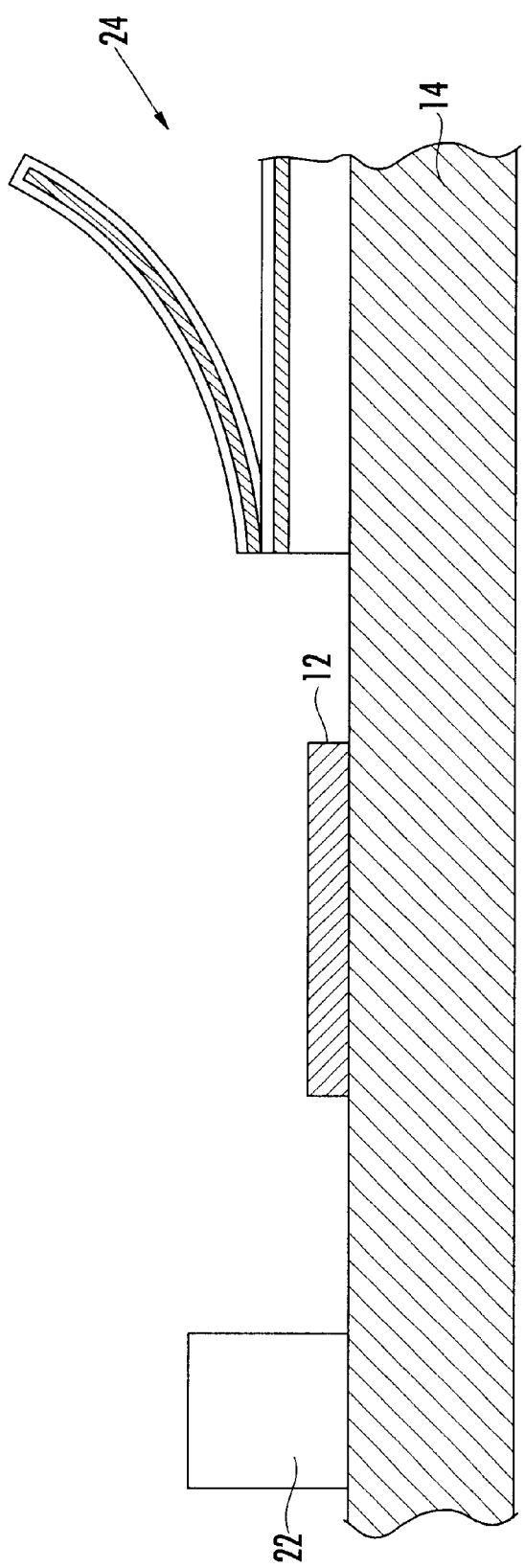

FIG. 4C shows the hybrid MEMS tunable capacitor construct after the fixed pivot structure 22 has been constructed on the first substrate 14 and the MEMS actuator device 24 has been attached to the first substrate. The fixed pivot structure will typically comprise a dielectric material, such as metal or silicon. To avoid the possibility of damage to the first capacitor plate the fixed pivot structure will typically be preformed and applied to the first substrate via conventional bonding techniques. In like fashion the backside of the substrate of the MEMS actuator device will typically be bonded to the first substrate as the means for attachment between the MEMS actuator device and the first substrate. A conventional bonding technique, such as wafer-to wafer bonding or epoxy bonding may be used to bond the MEMS actuator device to the first substrate.

Figure 4D:
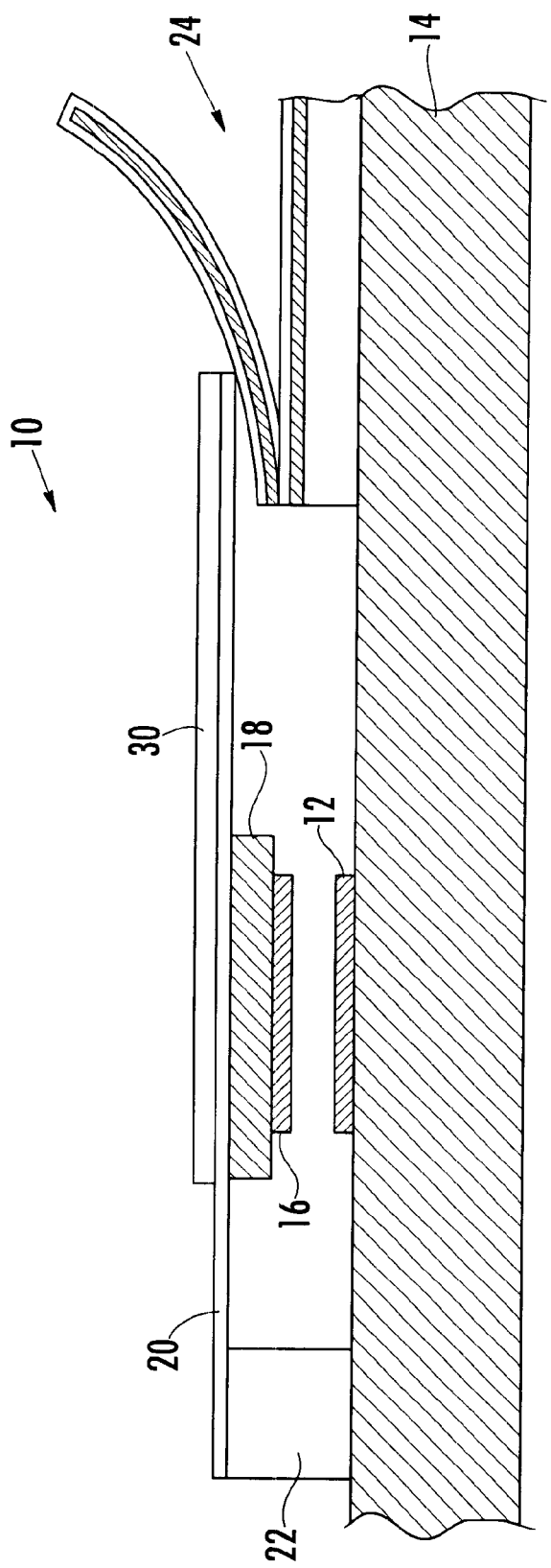

As shown in FIG. 4D, the hybrid MEMS tunable capacitor structure is completed by attaching the flexible membrane 20 and associated second substrate and second capacitor plate to the fixed pivot structure 22. The flexible membrane and associated second substrate and second capacitor plate are fabricated in a separate process. Typically, the flexible membrane and associated structures are formed on a sacrificial substrate and then lifted-off from the substrate either prior to or after attaching the flexible membrane to the fixed pivot structure. It is also possible to fabricate the flexible membrane and associated structures directly on the membrane and then affix the membrane to the fixed pivot structure. In those embodiments in which a support element is used, it will typically be formed on the sacrificial substrate prior to depositing the flexible membrane layer.

Accordingly, the fabrication method of this aspect of the present invention provides an efficient and repeatable technique for introducing the use of high temperature superconductor materials as capacitors in the field of micromachined tunable capacitors. As such, the resulting tunable capacitor can be precisely defined, small in size and MEMS actuated, while also having improved performance characteristics relative to conventional tunable capacitors. Thus, the tunable capacitors of the present invention can be used in a variety of applications, including those requiring high Q, such as, filtering signals having high frequencies.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A microelectromechanical system (MEMS) tunable capacitor comprising:

a first substrate having a first surface;

a first capacitor plate disposed on the first surface of said first substrate;

a flexible membrane generally overlying the first capacitor plate and capable of movement relative thereto;

a second substrate disposed on the underside of the flexible membrane and having a first surface generally facing the first substrate;

a second capacitor plate carried by the flexible membrane and disposed on the first surface of the second substrate, wherein said first and second capacitor plates face one another in a spaced apart relationship; and a microelectromechanical actuator operably contacting said flexible membrane for displacing said flexible membrane in response to actuation forces, thereby varying the capacitance between the first and second capacitor plates.

2. The MEMS tunable capacitor of claim 1, further comprising a fixed pivot point structure disposed on the first surface of said first substrate that provides a point of attachment for the flexible membrane.

3. The MEMS tunable capacitor of claim 2, wherein said microelectronic actuator operably contacts the flexible membrane proximate an end of the flexible membrane furthest from the fixed pivot structure.

4. The MEMS tunable capacitor of claim 1, wherein said first and second capacitor plate further comprise a high temperature superconductor material.

5. The MEMS tunable capacitor of claim 4, wherein said first and second capacitor plates further comprise a high temperature superconductor yttrium compound.

6. The MEMS tunable capacitor of claim 4, wherein said first and second capacitor plates further comprise a high temperature superconductor thallium compound.

7. The MEMS tunable capacitor of claim 1, wherein said microelectromechanical actuator farther comprises an electrostatic flexible film actuator.

8. The MEMS tunable capacitor of claim 7, wherein said electrostatic flexible film actuator comprises:
   a third substrate attached to the first substrate;
   a substrate electrode forming a layer on said third substrate;
   a flexible film composite overlying said substrate electrode and having an electrode element, and at least one biasing element, said flexible film having a fixed portion attached to the underlying third substrate and a distal portion extending from the fixed portion, generally overlying the substrate electrode and being moveable with respect to the substrate electrode; and
   an insulator electrically isolating said substrate electrode from said flexible film electrode element,
   whereby the flexible film is actuated in response to electrostatic force applied to the substrate electrode and the flexible film electrode element to thereby move the operably contacted flexible membrane and thus vary the capacitance between the first capacitor plate and the second capacitor plate.

9. The MEMS tunable capacitor of claim 1, wherein said microelectromechanical actuator further comprises a MEMS thermal bimorph actuator.

10. The MEMS tunable capacitor of claim 1, wherein said microelectromechanical actuator further comprises a MEMS thermal arched beam actuator.

11. The MEMS tunable capacitor of claim 1, wherein said microelectromechanical actuator further comprises a MEMS piezoelectric actuator.

12. The MEMS tunable capacitor of claim 1, wherein said first substrate further comprises a low signal loss substrate.

13. The MEMS tunable capacitor of claim 1, wherein said first and second substrates further comprise low signal loss substrates.

14. The MEMS tunable capacitor of claim 1, wherein said first substrate further comprises magnesium oxide (MgO).

15. The MEMS tunable capacitor of claim 1, wherein said first and second substrates further comprise magnesium oxide (MgO).

16. The MEMS tunable capacitor of claim 1, further comprising a support element disposed on the flexible membrane.

17. The MEMS tunable capacitor of claim 16, wherein the support element overlies at least a portion of the second substrate and extends towards the region where the flexible membrane contacts the microelectromechanical actuator.

18. The MEMS tunable capacitor of claim 16, wherein the support element has a predetermined plan view shape.

19. The MEMS tunable capacitor of claim 1, wherein the flexible membrane has a generally tapered shape in plan view that narrows as it approaches the contact region of the microelectromechanical actuator.

20. The MEMS tunable capacitor of claim 17, wherein the support element has a generally tapered shape in plan view that narrows as it approaches the contact region of the microelectromechanical actuator.

21. A microelectromechanical system (MEMS) tunable capacitor comprising:
   a first substrate having a first surface;
   a first capacitor plate disposed on the first surface of said first substrate;
   a flexible membrane generally overlying the first capacitor plate and capable of movement relative thereto;
   a second capacitor plate carried by the flexible membrane, wherein said first and second capacitor plates face one another in a spaced apart relationship; and
   a microelectromechanical actuator operably contacting said flexible membrane for displacing said flexible membrane in response to actuation forces, thereby varying the capacitance between the first and second capacitor plates.

22. The MEMS tunable capacitor of claim 21, further comprising a fixed pivot point structure disposed on the first surface of said first substrate that provides a point of attachment for the flexible membrane.

23. The MEMS tunable capacitor of claim 21, wherein said microelectronic actuator operably contacts the flexible membrane proximate an end of the flexible membrane furthest from the fixed pivot structure.

24. The MEMS tunable capacitor of claim 21, further comprising a second substrate disposed on the underside of the flexible membrane and having the second capacitor plate disposed on the second substrate.

25. The MEMS tunable capacitor of claim 21, wherein said first and second capacitor plate further comprise a high temperature superconductor material.

26. The MEMS tunable capacitor of claim 25, wherein said first and second capacitor plates further comprise a high temperature superconductor yttrium compound.

27. The MEMS tunable capacitor of claim 25, wherein said first and second capacitor plates further comprise a high temperature superconductor thallium compound.

28. The MEMS tunable capacitor of claim 21, wherein said microelectromechanical actuator further comprises an electrostatic flexible film actuator.

29. The MEMS tunable capacitor of claim 27, wherein said electrostatic flexible film actuator comprises:
   a third substrate attached to the first substrate;
   a substrate electrode forming a layer on said third substrate;
   a flexible film composite overlying said substrate electrode and having an electrode element, and at least one biasing element, said flexible film having a fixed portion attached to the underlying third substrate and a distal portion extending from the fixed portion, generally overlying the substrate electrode and being moveable with respect to the substrate electrode; and
   an insulator electrically isolating said substrate electrode from said flexible film electrode element,
   whereby the flexible film is actuated in response to electrostatic force applied to the substrate electrode and the flexible film electrode element to thereby move the operably contacted flexible membrane and thus vary the capacitance between the first capacitor plate and the second capacitor plate.

30. The MEMS tunable capacitor of claim 21, wherein said microelectromechanical actuator further comprises a MEMS thermal bimorph actuator.

31. The MEMS tunable capacitor of claim 21, wherein said microelectromechanical actuator farther comprises a MEMS thermal arched beam actuator.

32. The MEMS tunable capacitor of claim 21, wherein said microelectromechanical actuator further comprises a MEMS piezoelectric actuator.

33. The MEMS tunable capacitor of claim 21, wherein said first substrate further comprises a low signal loss substrate.

34. The MEMS tunable capacitor of claim 24, wherein said first and second substrates further comprise low signal loss substrates.

35. The MEMS tunable capacitor of claim 21, wherein said first substrate further comprises magnesium oxide (MgO).

36. The MEMS tunable capacitor of claim 24, wherein said first and second substrates further comprise magnesium oxide (MgO).

37. The MEMS tunable capacitor of claim 21, further comprising a support element disposed on the flexible membrane.

38. The MEMS tunable capacitor of claim 37, wherein the support element overlies at least a portion of the second substrate and extends towards the region where the flexible membrane contacts the microelectromechanical actuator.

* * * * *

UNITED STATES PATENT AND TRADEMARK OFFICE
CERTIFICATE OF CORRECTION

PATENT NO. : 6,377,438 B1
DATED : April 23, 2002
INVENTOR(S) : Deane et al.

It is certified that error appears in the above-identified patent and that said Letters Patent is hereby corrected as shown below:

<u>Title page,</u>
Item [56], References Cited, U.S. PATENT DOCUMENTS, "Macdonald et al." should read -- MacDonald et al. --.

<u>Column 11,</u>
Line 5, "farther" should read -- further --;
Line 59, "claim 17" should read -- claim 16 --.

<u>Column 12,</u>
Line 60, "farther" should read -- further --.

Signed and Sealed this

Twenty-fourth Day of September, 2002

*Attest:*

JAMES E. ROGAN
*Attesting Officer*     *Director of the United States Patent and Trademark Office*